United States Patent
Lin et al.

(10) Patent No.: US 11,335,427 B1
(45) Date of Patent: May 17, 2022

(54) MEMORY TEST CIRCUIT

(71) Applicant: Elite Semiconductor Microelectronics Technology Inc., Hsinchu (TW)

(72) Inventors: Yu-Tao Lin, Hsinchu (TW); Tse-Hua Yao, Hsinchu (TW); Yi-Fan Chen, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 17/088,608

(22) Filed: Nov. 4, 2020

(51) Int. Cl.
  *G11C 8/06* (2006.01)
  *G11C 29/38* (2006.01)
  *G06F 3/06* (2006.01)

(52) U.S. Cl.
  CPC ............ *G11C 29/38* (2013.01); *G06F 3/0619* (2013.01); *G06F 3/0653* (2013.01); *G06F 3/0673* (2013.01); *G11C 8/06* (2013.01)

(58) Field of Classification Search
  CPC ......... G11C 29/38; G11C 8/06; G06F 3/0619; G06F 3/0673; G06F 3/0653
  USPC ....................................................... 714/718
  See application file for complete search history.

(56) References Cited

U.S. PATENT DOCUMENTS

| | | | | |
|---|---|---|---|---|
| 6,111,801 A * | 8/2000 | Brady | ..................... | G11C 29/02 365/200 |
| 6,392,938 B1 | 5/2002 | Choi | | |
| 7,577,885 B2 * | 8/2009 | Hasegawa | ............... | G11C 29/54 714/719 |
| 9,202,595 B2 | 12/2015 | Wilson | | |
| 2002/0149985 A1 * | 10/2002 | Shimizu | ................ | G11C 11/406 365/222 |
| 2005/0104617 A1 * | 5/2005 | Abe | ..................... | H03M 1/1057 326/82 |
| 2006/0227617 A1 * | 10/2006 | Otsuka | ................. | G11C 29/027 365/185.22 |
| 2006/0239088 A1 * | 10/2006 | Anand | .................. | G11C 17/165 365/200 |
| 2008/0239854 A1 * | 10/2008 | Tomita | .............. | G11C 11/40603 365/222 |
| 2009/0213671 A1 | 8/2009 | Koo | | |
| 2016/0372214 A1 * | 12/2016 | Shim | ....................... | G11C 17/18 |
| 2019/0108893 A1 * | 4/2019 | Shim | ....................... | G11C 17/16 |
| 2019/0128959 A1 * | 5/2019 | Moon | .............. | G01R 31/31701 |
| 2019/0385692 A1 * | 12/2019 | Nakaoka | ................ | G11C 29/81 |

* cited by examiner

*Primary Examiner* — Albert Decady
*Assistant Examiner* — Enam Ahmed
(74) *Attorney, Agent, or Firm* — Winston Hsu

(57) ABSTRACT

A memory test circuit comprising: a first latch circuit for receiving a first input address and an error indication signal to generate a first address; a first E-fuse group for receiving the first address to generate an output address; a second latch circuit for receiving the error indication signal; a second E-fuse group for generating an error indication signal according to an output of the second latch circuit which is generated according to the fault indication signal; and a comparison circuit for activating the second latch circuit according to a relation between the first address and a second input address and a state of the first latch circuit or the first E-fuse group.

10 Claims, 4 Drawing Sheets

MEMORY TEST CIRCUIT

BACKGROUND OF THE INVENTION

1. Field of the Invention

The present invention relates to a memory test circuit, and particularly relates to a memory test circuit which can automatically provide the error type of the memory device.

2. Description of the Prior Art

Memory test can usually be classified into chip probe (CP) test mode and final test (FT) mode. The CP test can also be called die test, and the final test is a test after the memory is packaged. The memory usually has multiple redundant word lines. When an error is found in the word line of the memory, the redundant word line is used to replace the word line with errors. However, in the FT mode, the memory can only store a very small number of addresses for word lines with errors, that is, only a very small number of redundant word lines can be used. When the number of addresses for word lines with errors is greater than the number of word line error addresses that can be stored, the memory will be determined as irreparable.

However, when the memory has errors, it may be caused by other reasons besides the number of addresses for word lines with errors is greater than the number of word line error addresses that can be stored. In the current memory test method, when the memory has an error, it needs a lot of efforts and time to confirm the type of error.

SUMMARY OF THE INVENTION

Therefore, one objective of the present invention is to provide a memory test circuit which can automatically provide an error type.

A memory test circuit, comprising: a first latch circuit, configured to receive a first input address and an error indication signal, to generate a first address, wherein the error indication signal indicates whether the first input address is an error address; a first E-fuse group, configured to receive the first address to generate an output address; a second latch circuit, configured to receive the error indication signal; a second E-fuse group, configured to generate an error indication signal according to the error indication signal received by the second latch circuit, wherein the error indication signal indicates whether a number of damaged word lines is larger than a predetermined redundant word line number; and a comparison circuit, configured to compare the first address and a second input address, and configured to generate a comparison signal for activating the second latch circuit according to a relation between the first address and the second input address, and at least one state of the first latch circuit or the first E-fuse group.

In view of above-mentioned embodiments, the memory test circuit provided by the present invention can provide reference information of the error type, such that the conventional issue that a lot of efforts and time to confirm the error type can be improved.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. Each component in following descriptions can be implemented by hardware (e.g. a device or a circuit) or hardware with software (e.g. a program installed to a processor). It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention.

Figure 1:
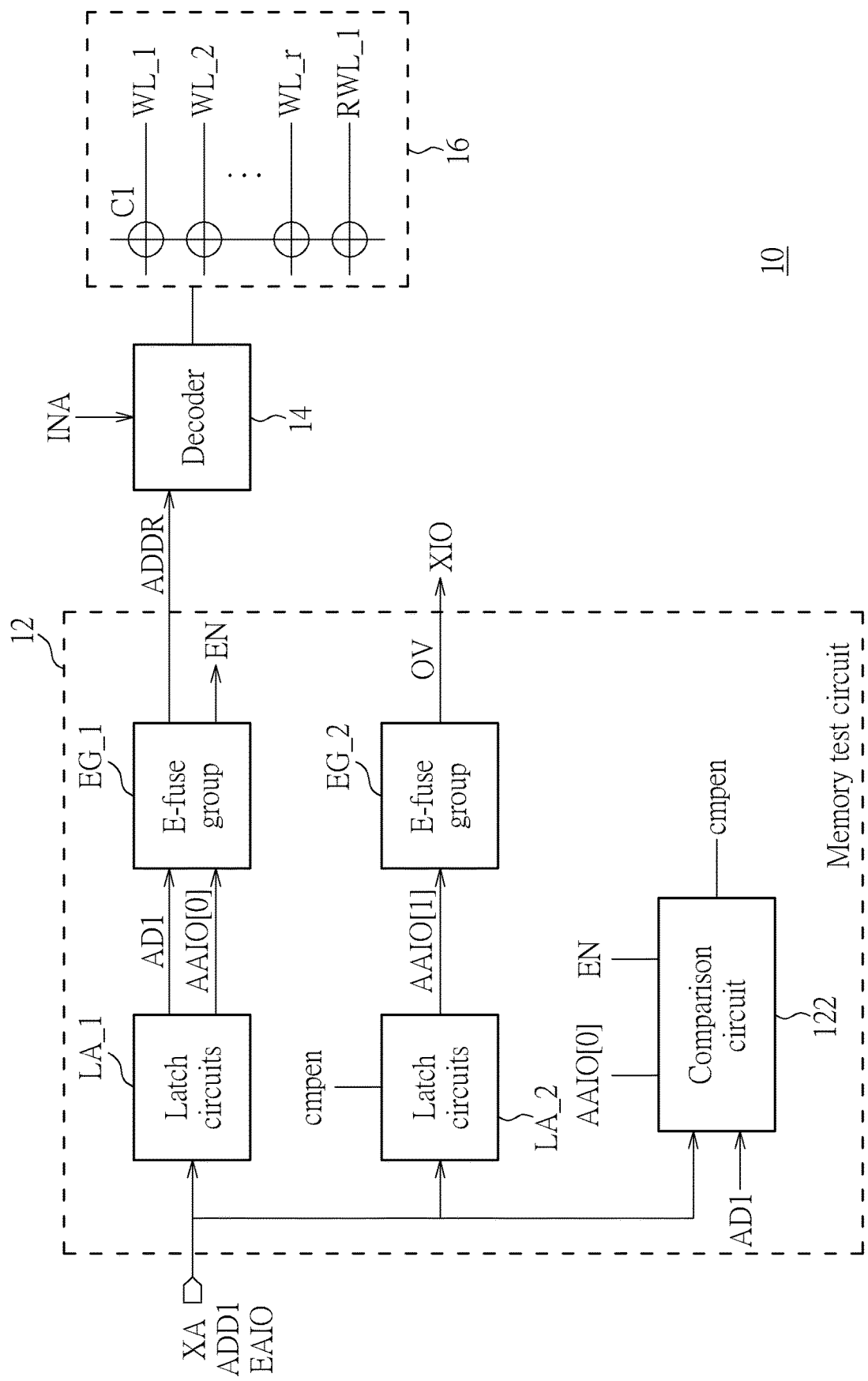
FIG. 1 is a block diagram illustrating a memory test circuit according to one embodiment of the present invention.

FIG. 1 is a block diagram illustrating a memory test circuit according to one embodiment of the present invention. The detailed operations will be illustrated below. Moreover, the memory test circuit described in the following embodiments is used in the FT mode, but the memory test circuit provided by the present invention can also be used in different modes. In addition, the memory test circuit provided by the present invention can also be used in other types of semiconductor devices.

The memory device 10 comprises a memory test circuit 12, a decoder 14 and a memory array 16. The memory array 16 comprises a plurality of memory cells Cl. The memory cells Cl are arranged in a matrix and are electrically coupled to corresponding word lines and bit lines.

In this embodiment, the memory array 16 comprises at least one redundant word line RWL_1. When the memory device 10 enters the FT mode and the normal word line is found to be damaged (i.e., having errors), the damaged word line will be replaced with a redundant word line in the normal mode. For example, if the word line WL_1 among the word lines WL_1 to WL_r is found to be a damaged word line, the decoder 14 selects the redundant word line RWL1 to replace the damaged word line WL_1 when the memory device 10 is accessed in the normal mode. Due to the limited area of the memory device 10, the number of redundant word lines comprised in the memory array 16 is limited. If the number of damaged word lines exceeds the number of redundant word lines, the memory device 10 is regarded as irreparable.

Referring to FIG. 1, the memory test circuit 12 comprises latch circuits LA_1, LA_2, an E-fuse group EG_1, an E-fuse group EG_2, and a comparison circuit 122. Each one of the E-fuse group EG_1 and the E-fuse group EG_2 comprises at least one E-fuse (electronic fuse). The latch circuit LA_1 comprises a plurality of latches (not shown), which is used to receive a first input address ADD1 and an error address indication signal EAIO via the receiving terminal XA (for example, address pin) to generate the first address AD1 and the latch circuit state signal AAIO[0]. The error address indication signal EAIO is used to indicate whether the first input address ADD1 is an error address (that is, whether the address corresponds to a damaged word line). The E-fuse (not shown) in the first E-fuse group EG_1 is used to receive the first address AD1 and the latch circuit state signal AAIO[0] to generate the output address ADDR and the fuse indication signal EN in the burn mode. When the memory device 10 is accessed in the normal mode, the memory array 16 uses the redundant word line based on the output address ADDR to replace the damaged word line.

In one embodiment, the error address indication signal EAIO is generated by inputting a test pattern from the input terminal XA. Then, after starting a corresponding word line, the data is read. Next, the data is send to the receiving terminal XA for output. In such process, a circuit (not shown) compares whether the output data is the same as the written. The above-mentioned error address indication signal EAIO is the result of such comparison.

The latch circuit LA_2 comprises a latch (not shown), which is used to receive the error address indication signal EAIO to generate the latch circuit state signal AAIO[1]. The E-fuse group EG_2 is used to receive the latch circuit state signal AAIO[1] to generate the error indication signal OV. The comparison circuit 122 is used for comparing the first address AD1 with a second input address received via the receiving terminal XA, thereby generating a comparison signal cmpen to activate the latch circuit LA_2. The error indication signal OV is used to indicate whether the number of damaged word lines found in the FT mode exceeds the number of redundant word lines.

Please refer to FIG. 1, the decoder 14 may be a row decoder or a column decoder, that is, the redundant word line RWL1 may be a row redundant word line or a column redundant word line. Hereinafter, a more detailed example will be used to illustrate the operations of the memory device 10 according to the embodiment of the present invention. For brevity, in the following example, the memory device 10' in FIG. 2 and FIG. 3 only has one redundant word line RWL1.

The FT mode comprises two stages: the register/comparison stage and the burn stage. In the register/comparison stage, the latch circuit LA_1 receives the input address ADD1 in series and the error address indication signal EAIO via the receiving terminal XA. The error address indication signal EAIO is used to indicate whether the input address ADD1 is an error address. In the burn state, the E-fuse group EG_1 burns the corresponding E-fuse according to the first address AD1 and the latch circuit state signal AAIO[0].

Figure 2:
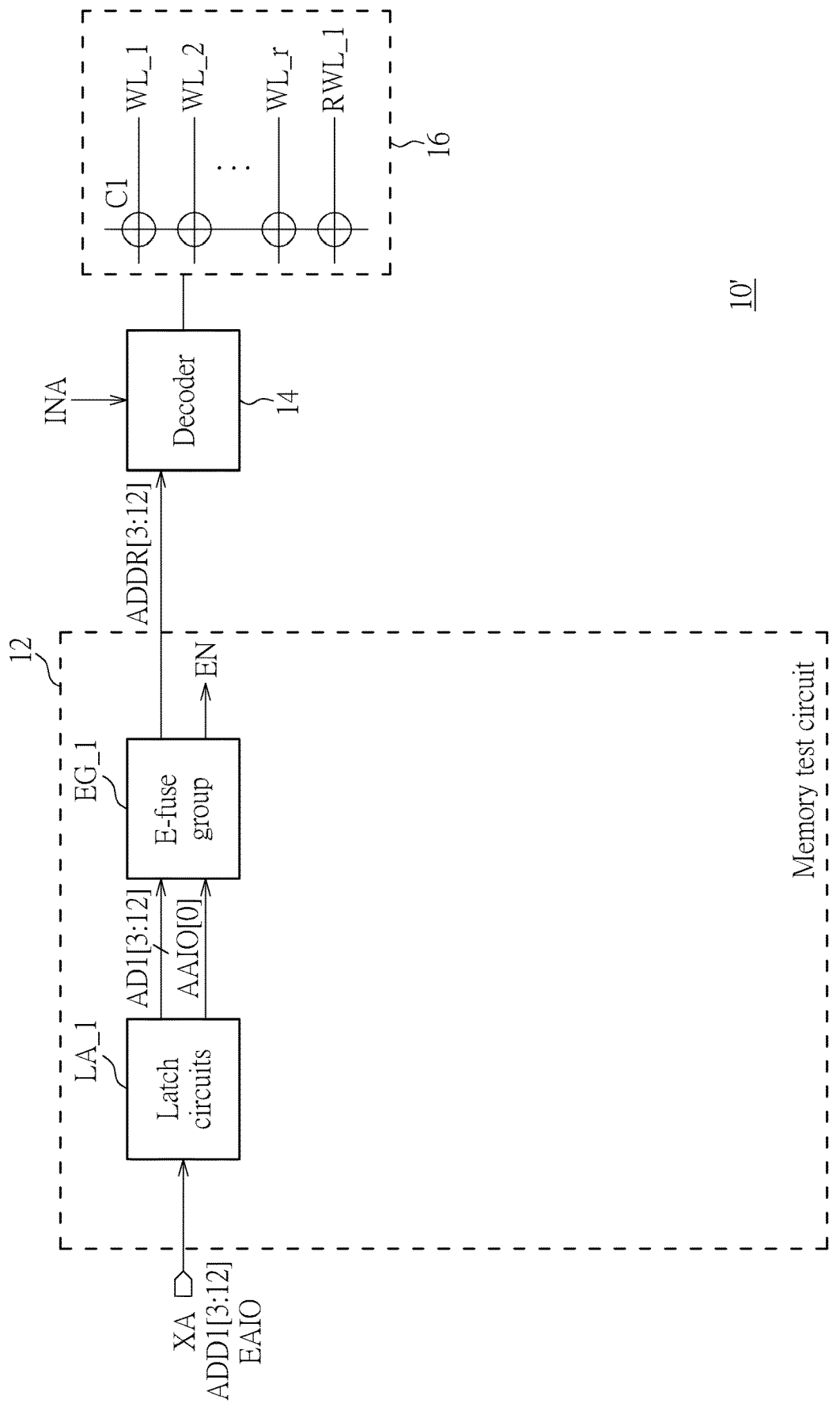
FIG. 2 and FIG. 3 are schematic diagrams illustrating operations of the memory test circuit of FIG. 1 in different states.

In the FT mode, the latch circuit LA_1 and the E-fuse EG_1 may have three conditions. In the first condition, the latch circuit LA_1 and the E-fuse EG_1 do not receive signals yet. In such case, as shown in FIG. 2, if the latch circuit LA_1 receives a new input address ADD1[3:12] and the error address indication signal EAIO indicates that the address ADD1[3:12] is an error address, the latch circuit LA_1 stores the address ADD1[3:12] and the error address indication signal EAIO, and correspondingly generates the first address AD1[3:12] and the latch circuit state signal AAIO[0]. The latch circuit state signal AAIO[0] indicates the usage state (in this example, the state is "used") of the latch circuit LA_1, and the latch circuit state signal AAIO[0] is transmitted to the comparison circuit 122 to activate the comparison operation.

In this embodiment, the E-fuse group EG_1 comprises 11 E-fuses (not shown). After receiving the first address AD1 [3:12] and the latch circuit state signal AAIO[0], the E-fuses generate the output address ADDR[3:12] and the fuse state signal EN during the burn mode. The fuse state signal EN indicates that the 11 electronic fuses of the E-fuse EG_1 have been used. When the memory device 10 is accessed in the normal mode, if the input address INA is the same as the address ADDR [3:12], the decoding circuit 14 activates the redundant word line RWL1 instead of the original normal word line.

Figure 3:
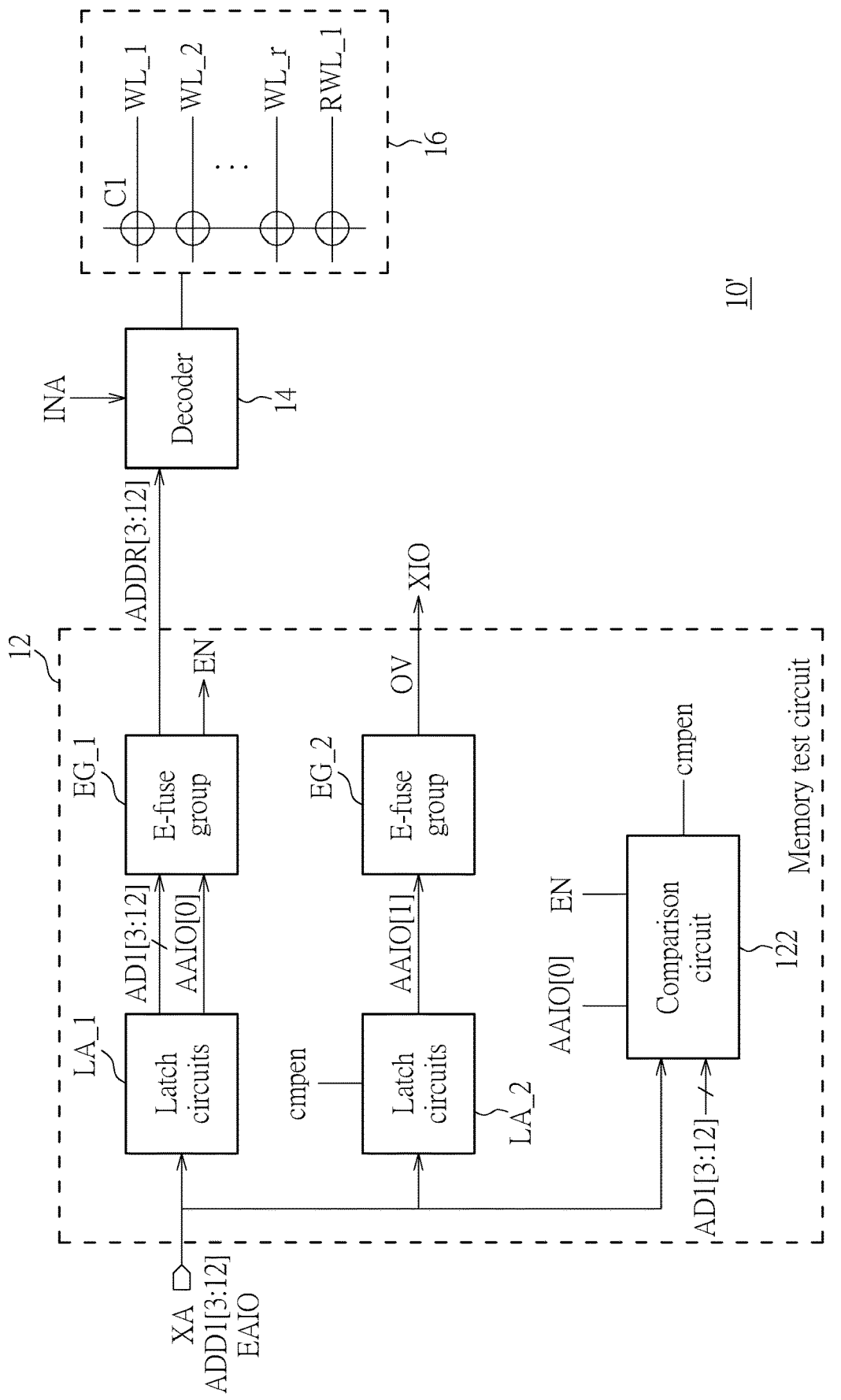

In the second condition, the latch circuit LA_1 has stored the input address ADD1[3:12] and the error address indication signal EAIO, and generates the first address AD1[3:12] and the latch circuit state signal AAIO [0]. In such case, as shown in FIG. 3, if the latch circuit LA_1 receives a new input address ADD2[3:12], the comparison circuit 122 has been activated by the latch circuit state signal AAIO[0], such that the first address AD1[3:12] can be compared with the new input address ADD2[3:12]. If the new input address ADD2[3:12] and the first address AD1[3:12] are the same, the comparison circuit 122 does not generate the comparison signal cmpen, so the latch circuit LA_2 will not be activated. If the new input address ADD2[3:12] and the address AD1[3:12] are different, the comparison circuit 122 generates a comparison signal cmpen, so the latch circuit LA_2 is activated. In such case, if the error address indication signal EAIO received by the latch circuit LA_2 indicates that the input address ADD2[3:12] is an error address, the latch circuit LA_2 generates the latch circuit state signal AAIO [1], which indicates the usage state (used) of the latch circuit LA_2.

In the burn stage, the E-fuse group EG_1 receives the first address AD1[3:12] and the latch circuit state signal AAIO [0], and then generates the output address ADDR [3:12] and the fuse state signal EN. The E-fuse group EG_2 receives the latch circuit state signal AAIO[1] and then generates an error indication signal OV, which indicates that two normal word lines of the memory array 16 are damaged. Since the memory device 10' only has one redundant word line RWL_1, the tester can clearly know that the number of damaged word lines in the memory device 10' exceeds the number of redundant word lines when he reads the error indication signal OV via the XIO terminal. No further error analysis is required.

In the third condition, the E-fuses 11 of the E-fuse group EG_1 have been used, so the fuse state signal EN has changed the logic level. As shown in FIG. 3, when the fuse state signal EN changes the logic level, the comparison circuit 122 is forced to generate the comparison signal cmpen, so the latch circuit LA_2 is activated. In such case, if the error address indication signal EAIO received by the latch circuit LA_2 indicates that the new input address ADD2[3:12] is an error address, the latch circuit LA_2 generates the latch circuit state signal AAIO[1]. In the burn state, the E-fuse group EG_2 receives the latch circuit state signal AAIO[1] and generates an error indication signal OV, which indicates that the number of damaged word lines in the memory element 10' exceeds the number of redundant word lines.

Accordingly, when the FT test is performed on the memory device 10', if the error indication signal OV has a first logic level (for example, 0) and the memory device 10' has an error state, it represents error of the memory device 10' is not due to that the number of damaged word lines exceeds the number of redundant word lines (that is, it exceeds a predetermined number of redundant word lines). In other words, there is at least one redundant word lines which is still can be used, so further analysis of the memory components is required to confirm if any other error exists. For example, confirm whether the error address is completely written into the E-fuse group, or the quality of the redundant word line is not good, or the test pattern has an error. Conversely, when the error indication signal OV has a second logic level (for example, 1) and the memory device 10 displays an error state, it means that the number of damaged word lines exceeds the number of redundant word lines. In other words, there is no redundant word line which can be used but at least one normal word line is damaged, so it can be directly determined that the memory element 10' is irreparable.

As mentioned above, the E-fuse group EG_1 is not limited to only store a set of error addresses. In one embodiment, the E-fuse group EG_1 can store multiple sets of error addresses. In such embodiment, multiple comparison circuits are needed to compare whether the new input addresses are the same as multiple sets of stored error addresses. Finally, the tester reads the error indication signal OV via the XIO terminal to know whether the number of damaged word lines in the memory device 10' exceeds the number of redundant word lines, and then proceeds further error analysis.

In view of above-mentioned descriptions, the memory test circuit of this case can be briefly described as: a memory test circuit comprising a plurality of latch circuits and a plurality of E-fuse groups. At least one the latch circuit (e.g., the first latch circuit LA_1) and at least one the E-fuse group (e.g., the first E-fuse group EG_1) determine whether an input address should be stored according to if a first input address is an error address. At least one of other ones of the latch circuits (e.g., the second latch circuit LA_2) and at least one of other ones of the E-fuse groups (e.g., the second E-fuse group EG_2) generate an error indication signal according to states of the latch circuits and the E-fuse groups, which store the first input address, and a relation between the first input address and a second input address. The error indication signal indicates whether a number of damaged word lines is larger than a predetermined redundant word line number.

Figure 4:
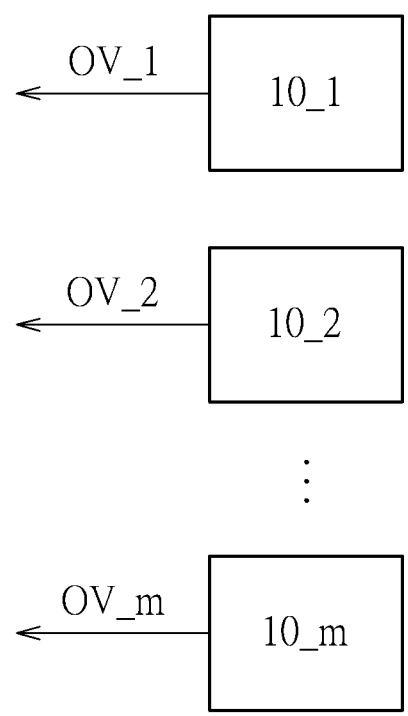
FIG. 4 is a schematic diagram illustrating the error analyzing of a plurality of memory devices.

FIG. 4 shows the error analysis of multiple memory devices 10_1, 10_2, . . . , 10_m (after the memory IC packaging is completed). The tester first reads and writes data to the cell within memory devices 10_1, 10_2, . . . , 10_m. When the output data is equal to the input data, the memory device is displayed as pass; when the output data is not equal to the input data, the memory device is displayed as "Fail" (or error, damaged). In such case, the tester reads the error indication signal OV respectively from the XIO terminals of the memory devices, and it can be clearly known which memory devices have a number of damaged word lines less than the number of redundant word lines. If the number of damaged word lines is less than the number of redundant word lines but the memory devices still have error states, the tester will proceed further error analysis on the memory devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory test circuit, comprising:
   a first latch circuit, configured to receive a first input address and an error address indication signal, to generate a first address, wherein the error address indication signal indicates whether the first input address is an error address;
   a first E-fuse group, configured to receive the first address to generate an output address;
   a second latch circuit, configured to receive the error address indication signal;
   a second E-fuse group, configured to generate an error indication signal according to the error address indication signal received by the second latch circuit, wherein the error indication signal indicates whether a number of damaged word lines is larger than a predetermined redundant word line number; and
   a comparison circuit, configured to compare the first address and a second input address, and configured to generate a comparison signal for activating the second latch circuit according to a relation between the first address and the second input address, and at least one state of the first latch circuit or the first E-fuse group.

2. The memory test circuit of claim 1, applied to a memory device comprising a memory array, wherein the memory array replaces the damaged word line with the redundant word line based on the output address when the memory device is accessed in a normal mode.

3. The memory test circuit of claim 1, wherein the first latch circuit further generates a first latch circuit state signal according to the first input address and the error address indication signal, wherein the first latch circuit state signal indicates a usage state of the first latch circuit and is used to activate the comparison circuit.

4. The memory test circuit of claim 1, wherein the second latch circuit further outputs a second latch circuit state signal according to the error address indication signal, wherein the second latch circuit state signal indicates a usage state of the second latch circuit, wherein the second E-fuse group generates the error indication signal according to the second latch circuit state.

5. The memory test circuit of claim 1, wherein the second latch circuit is enforced to be active when at least one E-fuse in the first E-fuse group has recorded the error address.

6. The memory test circuit of claim 5,
   wherein the first E-fuse group further generates a fuse indication signal, wherein the fuse indication signal indicates a usage state of the first E-fuse group and the comparison circuit receives the fuse indication signal;
   wherein the fuse indication signal controls the comparison circuit to enforce the second latch circuit to be activated when at least one E-fuse in the first E-fuse group has recorded the error address.

7. The memory test circuit of claim 5,
   wherein the second latch circuit generates a second latch circuit state signal when the error address indication signal indicates that the second input address is the error address after the second latch circuit is activated;
   wherein the second latch circuit state signal indicates a usage state of the second latch circuit;
   wherein the second E-fuse group generates the error indication signal according to the second latch circuit state signal.

8. The memory test circuit of claim 1, wherein the first latch circuit stores the first input address and the error address indication signal to generate the first address if the first latch circuit receives the first input address before the first latch circuit and the first E-fuse group receives any other signal and if the error address indication signal indicates the first input address is the error address.

9. The memory test circuit of claim 1,
   wherein the comparison circuit compares the second input address and the first address, when the first latch circuit has stored the first input address and the error address indication signal and generates the first address;
   wherein the comparison circuit activates the second latch circuit when the second input address and the first address are different, and the comparison circuit does not activate the second latch circuit when the second input address and the first address are the same.

10. A memory test circuit, comprising:

a plurality of latch circuits and a plurality of E-fuse groups;

wherein at least one of the latch circuits and at least one of the E-fuse groups determine whether an input address should be stored according to if a first input address is an error address;

wherein at least one of the latch circuits and at least one of the E-fuse groups generate an error indication signal according to states of the latch circuits and the E-fuse groups, which store the first input address, and a relation between the first input address and a second input address, wherein the latch circuit, the E-fuse group which determine whether the input address should be stored and the latch circuit, the E-fuse group which generate the error indication signal are different ones of the latch circuits and the E-fuse groups;

wherein the error indication signal indicates whether a number of damaged word lines is larger than a predetermined redundant word line number.

\* \* \* \* \*